United States Patent
Sewiolo

(10) Patent No.: US 11,962,203 B2
(45) Date of Patent: Apr. 16, 2024

(54) METHOD FOR MONITORING THE OPERATION OF A DRIVE COMPONENT

(71) Applicant: Siemens Aktiengesellschaft, Munich (DE)

(72) Inventor: Benjamin Sewiolo, Obermichelbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/035,674

(22) PCT Filed: Oct. 12, 2021

(86) PCT No.: PCT/EP2021/078085
§ 371 (c)(1),
(2) Date: May 5, 2023

(87) PCT Pub. No.: WO2022/096233
PCT Pub. Date: May 12, 2022

(65) Prior Publication Data
US 2023/0396133 A1    Dec. 7, 2023

(30) Foreign Application Priority Data
Nov. 6, 2020    (EP) ..................... 20206216

(51) Int. Cl.
*H02K 11/35*    (2016.01)
*G01R 31/34*    (2020.01)
*H02J 50/10*    (2016.01)

(52) U.S. Cl.
CPC ........... *H02K 11/35* (2016.01); *G01R 31/343* (2013.01); *H02J 50/10* (2016.02)

(58) Field of Classification Search
CPC ........ H02K 11/35; G01R 31/343; H02J 50/10
(Continued)

(56) References Cited

U.S. PATENT DOCUMENTS 5,488,281 A * 1/1996 Unsworth ............... H02P 27/02
318/798
6,199,018 B1 * 3/2001 Quist .................. G01M 13/045
706/912

(Continued)

FOREIGN PATENT DOCUMENTS

DE    102018103428 A1    8/2018
DE    202019101047 U1    10/2019
(Continued)

OTHER PUBLICATIONS

Barusu et al., Non-invasive method for rotor bar fault diagnosis in three-phase squirrel cage induction motor with advanced signal processing technique, 2019 J. Engr. 4415-19 (2019), available at https://doi.org/10.1049/joe.2018.8242 (last accessed Oct. 12, 2023) (Year: 2019).*

(Continued)

*Primary Examiner* — Tung X Nguyen
*Assistant Examiner* — Robert P Alejnikov, Jr.
(74) *Attorney, Agent, or Firm* — Henry M. Feiereisen LLC

(57) ABSTRACT

Disclosed is a method for monitoring the operation of a drive component. In order to minimize additional hardware complexity, the monitoring method is cared out by a coil that is integrated in a mobile terminal by acquiring an electromagnetic variable of the drive component outside a housing of the drive component by the integrated coil, determining at least one first frequency based on the acquired electromagnetic variable, and determining a first status variable of the drive component from the at least one first frequency.

19 Claims, 3 Drawing Sheets

(58) Field of Classification Search
 USPC .................................................. 324/765.01
 See application file for complete search history.

(56) References Cited

U.S. PATENT DOCUMENTS

| | | | | |
|---|---|---|---|---|
| 7,324,008 | B2* | 1/2008 | Payne | G05B 23/0254 |
| | | | | 702/183 |
| 2013/0271052 | A1* | 10/2013 | Son | H02K 11/20 |
| | | | | 318/490 |
| 2014/0049285 | A1* | 2/2014 | Rodriguez | G01H 1/003 |
| | | | | 324/765.01 |
| 2017/0163200 | A1 | 6/2017 | Nardin et al. | |
| 2019/0267923 | A1* | 8/2019 | Anders | H02P 6/18 |

FOREIGN PATENT DOCUMENTS

| | | | |
|---|---|---|---|
| DE | 102018110554 | A1 | 11/2019 |
| EP | 2650667 | A2 | 10/2013 |
| EP | 3322088 | A1 | 5/2018 |
| EP | 3404810 | A1 | 11/2018 |
| EP | 3499710 | A1 | 6/2019 |

OTHER PUBLICATIONS

PCT International Search Report and Written Opinion of International Searching Authority dated Jul. 2, 2022 corresponding to PCT International Application No. PCT/EP2021/078085 filed Dec. 10, 2021.

\* cited by examiner

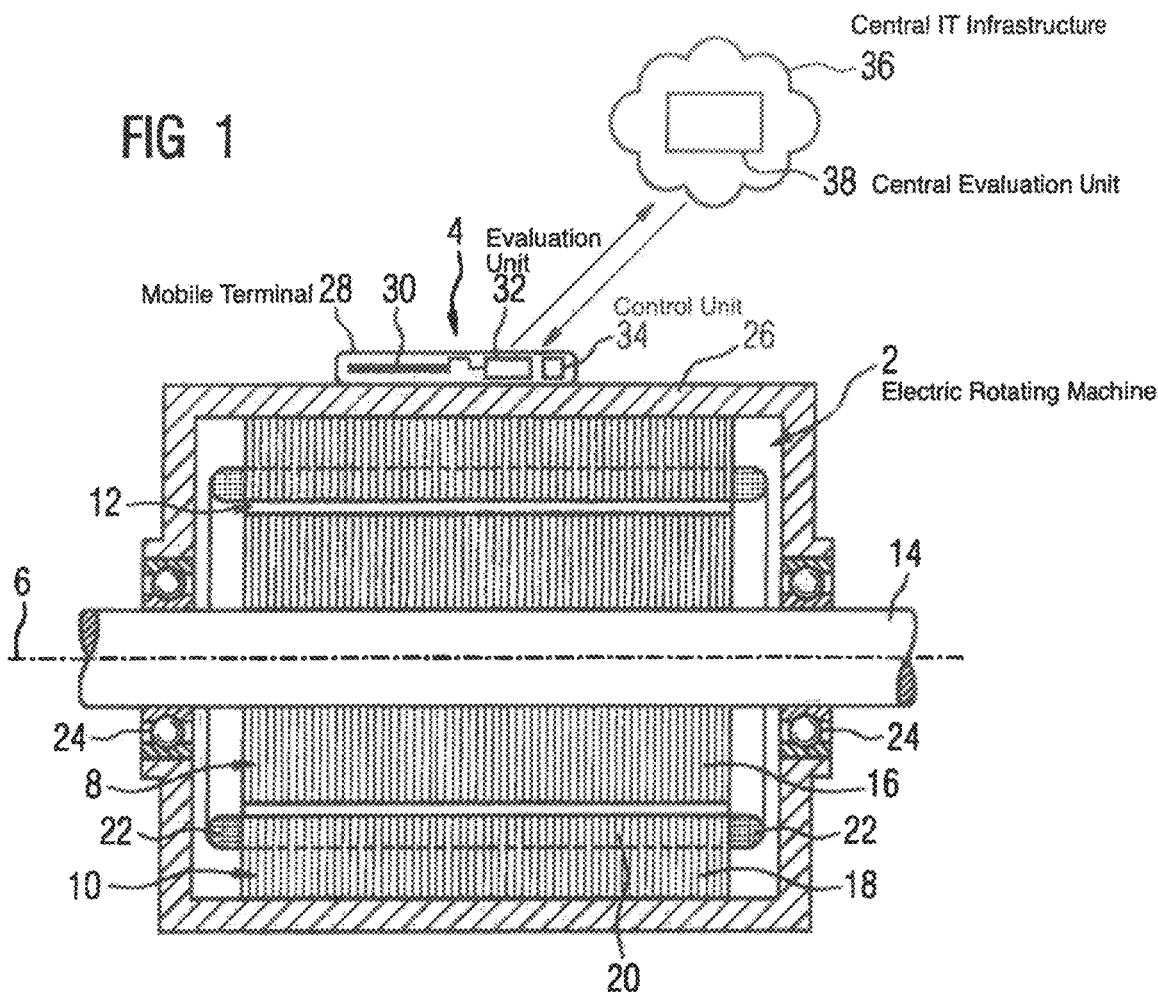
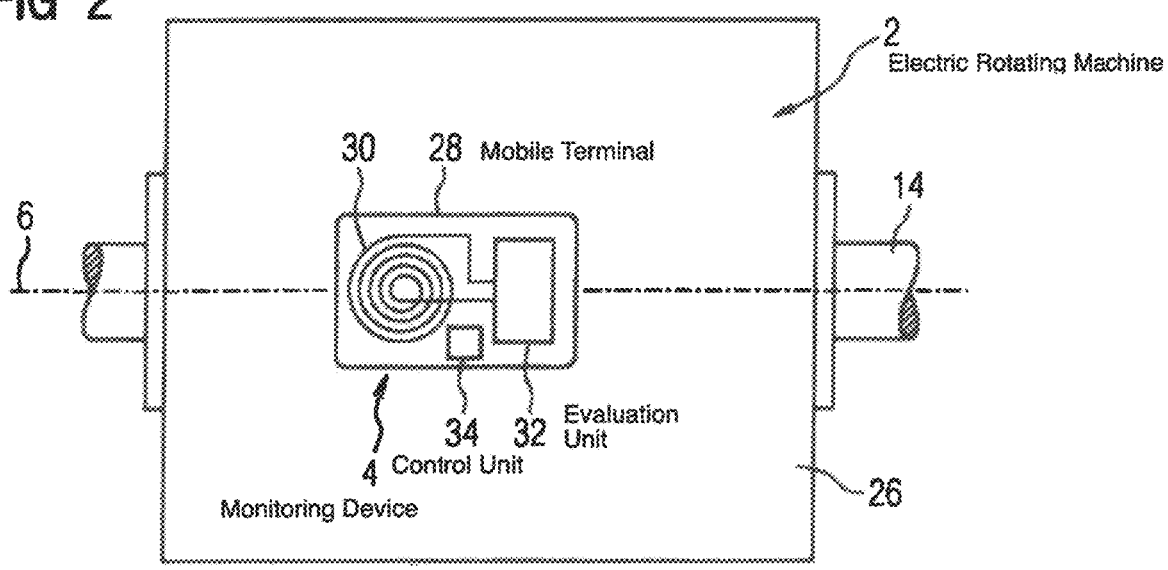

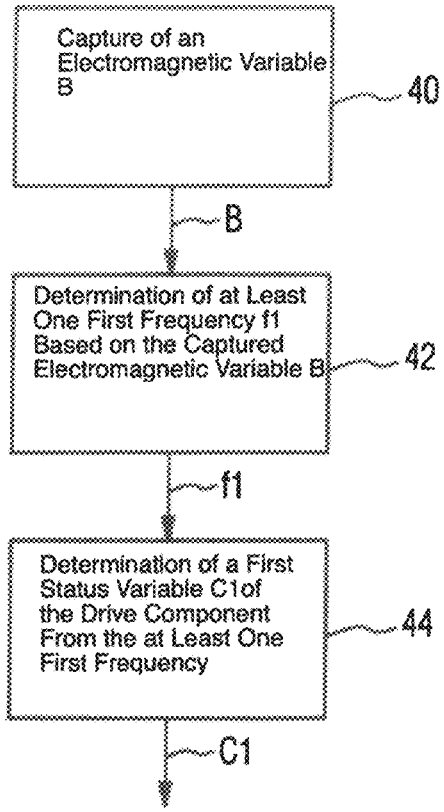
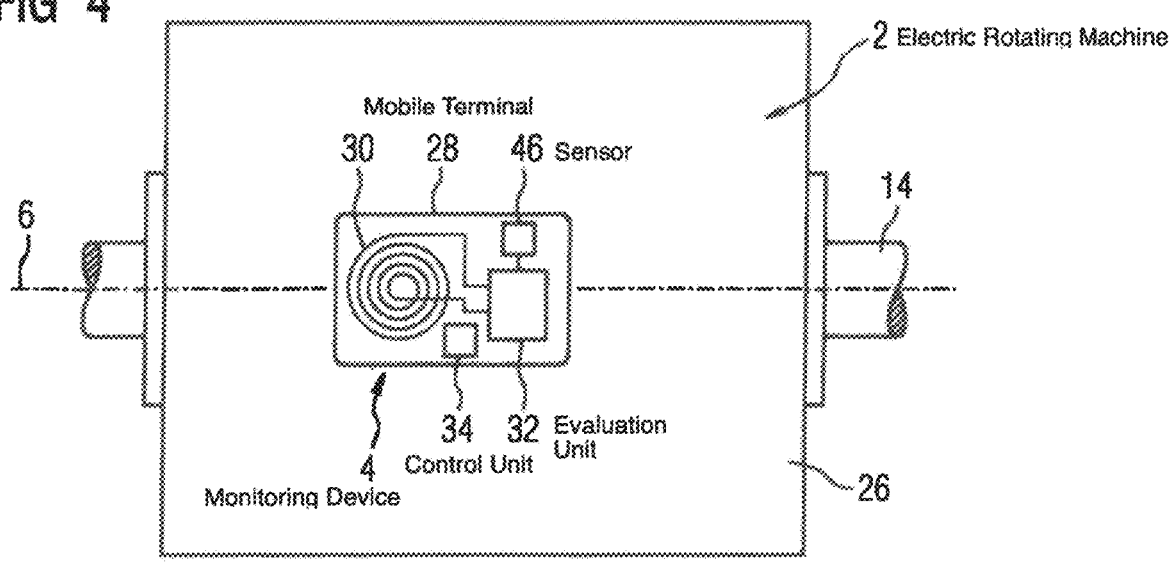

METHOD FOR MONITORING THE OPERATION OF A DRIVE COMPONENT

CROSS-REFERENCES TO RELATED APPLICATIONS

This application is the U.S. National Stage of International Application No. PCT/EP2021/078085, filed Oct. 12, 2021, which designated the United States and has been published as International Publication No. WO 2022/096233 A1 and which claims the priority of European Patent Application, Serial No. 20206216.2, filed Nov. 6, 2020, pursuant to 35 U.S.C. 119(a)-(d).

BACKGROUND OF THE INVENTION

The invention relates to a method for monitoring the operation of a drive component.

The invention further relates to a control unit having means for performing such a method.

Furthermore, the invention relates to a computer program for performing such a method when executed in a control unit.

The invention additionally relates to the use of a coil, which is integrated in a mobile terminal, for capturing an electromagnetic variable, The invention also relates to a device for monitoring the operation of a drive component.

Such a method for monitoring the operation of a drive component is deployed for example in an industrial environment comprising numerous automated processes, in order to coordinate servicing intervals or to initiate countermeasures promptly if required. Such a drive component is for example an electric rotating machine, in particular a motor or a generator, or a power converter, in particular a rectifier, an inverter, a frequency converter or a DC/DC converter. Determining such status variables usually requires significant metrological resources. However, such a monitoring method is intended to be performed without structural changes to the drive component so that actual operation is not affected. It is also intended to minimize any additional hardware overheads associated with the monitoring method.

The unexamined patent application EP 3 499 710 A1 describes a method for monitoring the operation of an electric rotating machine, in particular an asynchronous machine, having a rotor, a stator and a machine housing in which the rotor and the stator are accommodated. In order for the monitoring method to be able to be performed as easily as possible and without structural changes to the electric rotating machine, it is proposed to determine a slip frequency and a synchronous frequency by capturing a magnetic flux leakage field outside the machine housing, the slip frequency and the synchronous frequency being used to determine a torque and/or a rotational frequency of the rotor.

The unexamined patent application EP 3 404 810 A1 describes a method for monitoring the operation of an electric rotating machine having a rotor, a stator and a machine housing in which the rotor and the stator are accommodated. In order to achieve greater reliability in comparison with the prior art and without structural changes, it is proposed to capture at least one external temperature at at least one known position on an external surface of the machine housing, at least one internal temperature being determined from the captured external temperature by means of a temperature model that is provided in a cloud.

The unexamined patent application EP 2 650 667 A2 describes a device for analyzing a motor status in a mobile terminal comprising: a first detection unit which is configured to detect vibrations of a motor with which it is in direct contact and to return the vibrations to a controller; a second detection unit which is configured to detect the noise of the motor and to return the noise to the controller; and a controller which is configured to analyze a frequency from the vibrations and the noise of the motor in order to verify a change in the vibrations and thus obtain an analysis result for a status of the motor.

The unexamined patent application DE 10 2018 103 428 A1 describes a system for communicating with a motor, said system comprising an NFC antenna which is coupled to a motor arrangement and is configured to receive signals from a motor control device. The NFC antenna is configured to output a magnetic field with a selected frequency. The system further comprises a communication interface which is configured to forward the signals from the NFC antenna to a hand-held device.

The object of the invention is to specify a method for monitoring the operation of a drive component, which method can be performed using minimal additional hardware overheads.

SUMMARY OF THE INVENTION

The object is inventively achieved by a method for monitoring the operation of a drive component by means of a coil that is integrated in a mobile terminal, said method comprising steps as follows: capturing an electromagnetic variable of the drive component outside a housing of the drive component by means of the integrated coil, determining at least one first frequency on the basis of the captured electromagnetic variable, and determining a first status variable of the drive component from the at least one first frequency.

Furthermore, the object is inventively achieved by a control unit having means for performing such a method.

In addition to this, the object is inventively achieved by a computer program for performing such a method when executed in a control unit.

Moreover, the object is inventively achieved by the use of a coil, which is integrated in a mobile terminal, for capturing an electromagnetic variable of a drive component.

Further to this, the object is inventively achieved by a device for monitoring the operation of a drive component, said device comprising components as follows: a coil which is integrated in a mobile terminal and is configured to capture an electromagnetic variable of the drive component outside a housing of the drive component, and an evaluation unit which is configured to determine at least one first frequency on the basis of the captured electromagnetic variable and to determine a first status variable of the drive component from the at least one first frequency.

The advantages and preferred embodiments listed below in respect of the method can be applied analogically to the control unit, the computer program, the use and the device.

The invention is based on the idea of minimizing the additional hardware overheads that are required to monitor the operation of a drive component, by using a coil that is integrated in a mobile terminal, in particular a smartphone or a tablet. Such an integrated coil is for example arranged within a housing of the mobile terminal and/or permanently connected to the mobile terminal. In particular, such an integrated coil is already present in the mobile terminal ex works and is configured for contactless charging of the mobile terminal, for example using the Qi standard. The integrated coil can be embodied as a planar air-core coil, for example. A minimization of hardware overheads means that additional and in particular dedicated hardware for monitoring the operation of a drive component is reduced to a minimum. In this context, "dedicated hardware" for monitoring means that it is configured exclusively for this purpose. Such a drive component is for example an electric rotating machine, in particular a motor or a generator, or a power converter, in particular a rectifier, an inverter, a frequency converter or a DC/DC converter. When monitoring the operation of the drive component, the mobile terminal for capturing an electromagnetic variable is arranged outside a housing of the drive component, in particular in the region of a magnetic flux leakage field. For example, the integrated coil is positioned in the magnetic flux leakage field of the drive component by placing the mobile terminal on the housing. The electromagnetic variable is in particular a current which, for example as a result of an electromagnetic alternating field of the drive component, is induced in the integrated coil. In particular, the electromagnetic variable outside a rectifier is captured by the mobile terminal. For example, a signal which is already present is evaluated.

At least one first frequency is then determined on the basis of the captured electromagnetic variable. The determination of the at least one first frequency is effected by means of for example sampling followed by digital signal processing. A first status variable of the drive component is then determined from the at least one first frequency. Such a status variable is for example information relating to an operating status of the drive component, in particular whether and/or at what frequency the drive component is operating.

The determination of the at least one first frequency and then of the first status variable takes place for example in a central IT infrastructure. A central IT infrastructure is for example at least a local computer system or a cloud-based IT platform. Storage space, computing power and/or application software are provided in the central IT infrastructure. The mobile terminal is connected to the central IT infrastructure, in particular contactlessly via Bluetooth or WLAN. A computer program for performing a monitoring method is embodied for example as an app on the mobile terminal. A control unit, which in particular is part of the mobile terminal, has means for performing the method for example comprising a digital logic module, in particular a microprocessor, a microcontroller or an ASIC (application-specific integrated circuit). The use of the coil that is in in the mobile terminal allows the operation of a drive component to be monitored without having to make structural changes to the drive component itself. Moreover, no dedicated hardware is required for the monitoring method, and therefore the hardware overheads are minimized.

A further embodiment provides that at least the determination of the first frequency is performed by means of an evaluation unit of the mobile terminal, said evaluation unit being connected to the integrated coil. Such an evaluation unit is for example a digital logic module, in particular a microprocessor, a microcontroller or an ASIC. Since the evaluation unit is likewise part of the mobile terminal, the hardware overheads are again reduced and the monitoring method is simplified.

A further embodiment provides that the determination of the at least one first frequency takes place using a fast Fourier transform. By virtue of a fast Fourier transform, frequencies in the spectrum can easily be identified and analyzed with great accuracy. In particular, by means of averaging using the fast Fourier transform, analysis is possible even with a very low signal level of the frequency to be examined.

A further embodiment provides that the drive component is an electric rotating machine, in particular an asynchronous machine, comprising a rotor and a stator, the rotor and the stator being accommodated in the housing and the capture of the electromagnetic variable taking place outside the housing of the electric rotating machine. For example, the integrated coil measures an external flux leakage field of the stator, a stator frequency is determined from the temporal and in particular periodical change of said flux leakage field, from which stator frequency an operating status of the electric rotating machine can be derived. The determination of an operating state of the electric rotating machine via the stator frequency with the aid of the integrated coil of the mobile terminal is simple and economical to realize.

A further embodiment provides further steps as follows: capturing an additional physical variable of the drive component by means of a sensor that is integrated in the mobile terminal, determining at least one second frequency on the basis of the captured further physical variable, determining a second status variable of the drive component from the at least one first frequency and the at least one second frequency. For example, the at least one first frequency comprises a stator frequency and the at least one second frequency comprises a rotor frequency of an asynchronous machine. The second status variable determined is for example a torque which is delivered by an asynchronous machine and can be determined from the stator frequency and the rotor frequency. The determination of such a second status variable can be implemented easily and precisely.

A further embodiment provides that the capture of the additional physical variable is effected by measuring a vibration and/or an acoustic signal. In particular, the integrated sensor has an acceleration sensor and/or an acoustic sensor. The measurement of a vibration and/or an acoustic signal is effected essentially contactlessly outside the machine housing, and therefore no structural changes are required. In particular, an acceleration sensor and/or an acoustic sensor are normally part of a mobile terminal, for example a smartphone or tablet, such that no dedicated hardware is required and the hardware overheads are therefore minimized.

BRIEF DESCRIPTION OF THE DRAWING

The invention is described and explained in greater detail on the basis of the exemplary embodiments that are illustrated in the figures, in which:

FIG. 1 shows a schematic illustration of an electric rotating machine with a first embodiment of a monitoring device, FIG. 2 shows a schematic illustration of an electric rotating machine with a second embodiment of a monitoring device, FIG. 3 shows a sequence diagram of a first embodiment of a method for monitoring the operation of a drive component, FIG. 4 shows a schematic illustration of an electric rotating machine with a third embodiment of a monitoring device.

DETAILED DESCRIPTION OF PREFERRED EMBODIMENTS

Figure 5:
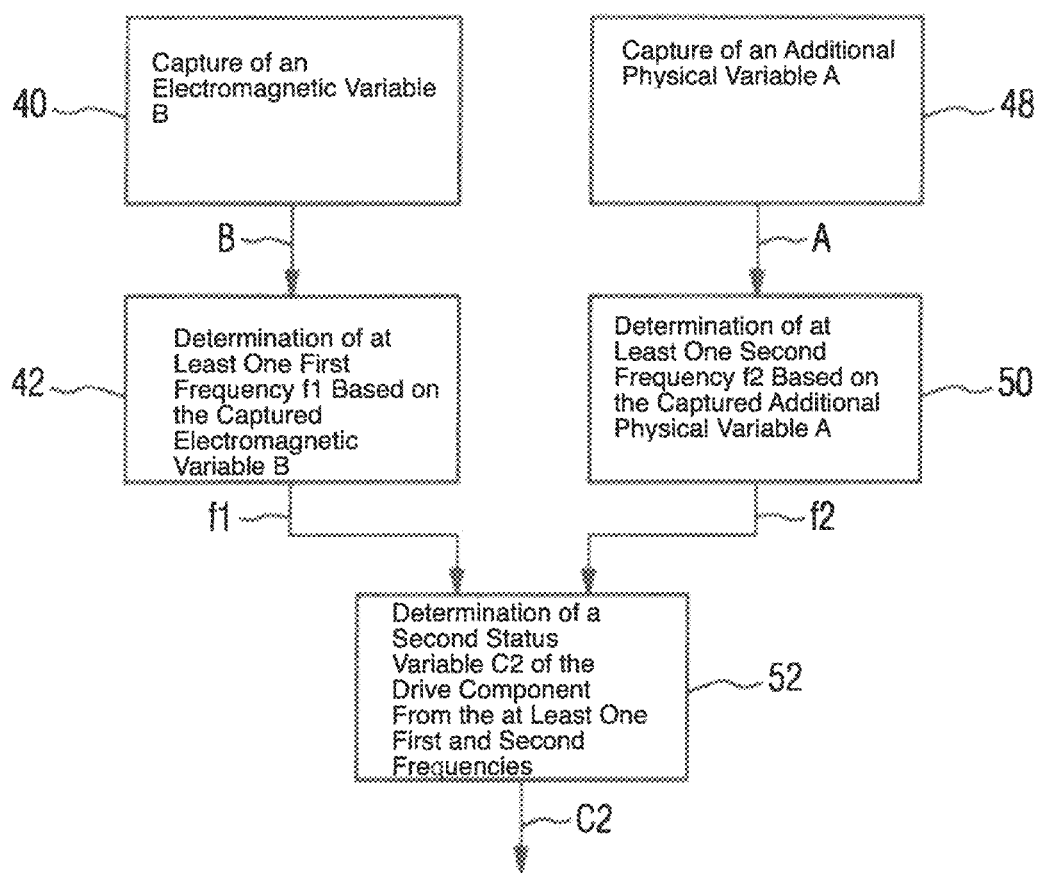
FIG. 5 shows a sequence diagram of a second embodiment of a method for monitoring the operation of a drive component.

The exemplary embodiments explained in the following are preferred embodiments of the invention. In the exemplary embodiments, the components described in respect of the embodiments each represent individual features of the invention which must be considered independently of each other and which develop the invention independently of each other and therefore must also be considered as part of the invention whether individually or in a combination other than that shown. Moreover, the embodiments described can also be extended by further features of the invention described above.

Identical reference signs have the same significance in the various figures.

FIG. 1 shows a schematic illustration of an electric rotating machine 2 with a first embodiment of a monitoring device 4. The electric rotating machine 2 is embodied as an asynchronous machine, for example, and has a rotor 8 which can rotate about a rotational axis 6 and a stator 10 which surrounds the rotor 8, a gap 12 embodied in particular as an air gap being situated between the rotor 8 and the stator 10. The rotational axis 6 defines an axial direction and a radial direction. The rotor 8 comprises a shaft 14 and a rotor core stack 16. The stator 10 comprises a stator core stack 18 with stator windings 20, the stator core stack 18 being constructed from a multiplicity of layered electrical steel sheets. The stator windings 20 run in an axial direction through the stator core stack 18 and form winding overhangs 22 at the axial ends thereof. The shaft 14 of the rotor 8 is mounted via bearings 24. The rotor 8 and the stator 10 are placed in a closed housing 26.

The monitoring device 4 comprises a mobile terminal 28 which is situated on the housing 26 of the electric rotating machine 2, for example. Alternatively, the mobile terminal 28 is situated on the housing 26 of another drive component, for example a power converter. The mobile terminal 28 is embodied as a smart device, for example a smartphone or tablet, which has an integrated coil 30. An integrated coil 30 is arranged within a housing of the mobile terminal 28 and/or is permanently connected to the mobile terminal 28. In particular, the integrated coil 30 is already present in the mobile terminal 28 ex works and is configured for contactless charging of the mobile terminal 28, for example using the Qi standard. The integrated coil 30, which is configured for contactless charging of the mobile terminal 28, is embodied in particular as a planar air-core coil having an inductance in the range of 1 µH to 200 µH, for example.

The coil 30 that is integrated in the mobile terminal 28 is configured to capture an electromagnetic variable outside the housing 26 of the electric rotating machine 2. As a result of placing the mobile terminal 28 on the housing 26, the integrated coil 30 is arranged for example in a magnetic flux leakage field of the electric rotating machine 2, whereby the electromagnetic variable can be captured. The electromagnetic variable is in particular a current which is induced in the integrated coil 30 by an electromagnetic alternating field of the electric rotating machine 2.

The integrated coil 30 is connected to an evaluation unit 32, said evaluation unit 32 being part of the mobile terminal 28. The evaluation unit 32 of the mobile terminal 28 is configured to determine at least one first frequency on the basis of the captured electromagnetic variable. The at least one first frequency comprises a stator frequency, for example. The evaluation unit 32 is further configured to determine a first status variable of the drive component from the at least one first frequency. Such a status variable is for example information relating to an operating status of the electric rotating machine 2, in particular whether and/or at what frequency the electric rotating machine is operating. Furthermore, the mobile terminal 28 has a control unit 34, which is likewise part of the mobile terminal 28.

The mobile terminal 28 is connected to a central IT infrastructure 36, in particular contactlessly. The connection is established via Bluetooth or WLAN, for example. A central IT infrastructure 36 is for example at least a local computer system or a cloud-based IT platform. Storage space, computing power and/or application software are provided in the central IT infrastructure 36. The central IT infrastructure 36 comprises for example a central evaluation unit 38 which is used for example to determine the first status variable. At least part of the control unit 34 is optionally assigned to the central IT infrastructure 36 and/or the central IT infrastructure 36 has a digital twin which is used to determine the first status variable. Such a digital twin is described in the unexamined patent application US 2017/0286572 A1, for example. The disclosure of US 2017/0286572 A1 is included in the present application by reference.

FIG. 2 shows a schematic illustration of an electric rotating machine 2 with a second embodiment of a monitoring device 4, wherein the mobile terminal 28 which comprises the integrated coil 30, the evaluation unit 32 and the control unit 34 is situated on the electric rotating machine 2. The evaluation unit 32 is configured to determine at least one first frequency on the basis of the captured electromagnetic variable and to determine a first status variable of the electric rotating machine 2 from the at least one first frequency. The evaluation unit 32 is part of the mobile terminal 28. Alternatively, an external evaluation unit connected to the integrated coil 30 for example via a cable, a wire or a switch device is configured to determine the at least one first frequency and to determine the first status variable. Such an external evaluation unit is embodied for example as a microcontroller or other programmable logic module. In particular, the electromagnetic variable B outside a rectifier is captured by the mobile terminal 28. For example, a signal which is already present is evaluated. In the event of a weak signal strength, for example due to the filter effect of the integrated coil 30, the at least one first frequency can be determined by means of correlation. The further embodiment of the electric rotating machine 2 with the monitoring device 4 in FIG. 2 corresponds to that in FIG. 1.

FIG. 3 shows a sequence diagram of a first embodiment of a method for monitoring the operation of a drive component. The monitoring method comprises the capture 40 of an electromagnetic variable B outside a housing 26 of a drive component by means of an integrated coil 30. The drive component is embodied for example as an electric rotating machine 2 or as a power converter. The electromagnetic variable B is in particular a current which is induced in the integrated coil 30 as a result of arranging the mobile terminal 28 in the region of a flux leakage field of the drive component.

The monitoring method further comprises the determination 42 of at least one first frequency f1 on the basis of the captured electromagnetic variable B. The determination 42 of the at least one first frequency (f1) takes place using a fast Fourier transform in particular. The at least one first frequency f1 comprises for example a stator frequency of an electric rotating machine or a frequency of a power converter.

The monitoring method additionally comprises the determination 44 of a first status variable C1 of the drive component from the at least one first frequency (f1). Such a status variable is for example information relating to an operating status of the drive component, in particular whether and/or at what frequency the drive component is operating.

FIG. 4 shows a schematic illustration of an electric rotating machine 2 with a third embodiment of a monitoring device 4. The mobile terminal 28 comprises a sensor 46 which is integrated in the mobile terminal 28 and is configured to capture an additional physical variable of the drive component. In particular, the sensor 46 has an acoustic sensor and/or an acceleration sensor. The additional physical variable is for example an acoustic signal and/or an acceleration signal. In particular, a vibration of the electric rotating machine 2 is captured by the acceleration sensor due to placement of the mobile terminal 28.

The evaluation unit 32 of the mobile terminal 28 is configured to determine at least one second frequency on the basis of the captured additional physical variable. For example, a rotor frequency of the electric rotating machine 2 can be determined from the captured acoustic signal and/or the acceleration signal. The further embodiment of the electric rotating machine 2 with the monitoring device 4 in FIG. 4 corresponds to that in FIG. 2.

FIG. 5 shows a sequence diagram of a second embodiment of a method for monitoring the operation of a drive component. The monitoring method comprises the capture 48 of an additional physical variable A of the drive component by means of a sensor 46 which is integrated in the mobile terminal 28. In particular, the additional physical variable A is an acoustic signal which is captured for example by an acoustic sensor, and/or an acceleration signal which is captured for example by an acceleration sensor.

The monitoring method further comprises the determination 50 of at least one second frequency f2 on the basis of the captured further physical variable A. The determination 50 of the at least one second frequency f2 takes place in particular using a fast Fourier transform. The at least one second frequency f2 comprises for example a rotor frequency of an electric rotating machine.

The capture 40 of the first electromagnetic variable B and the determination 42 of the at least one first frequency f1 takes place as per the sequence diagram in FIG. 3. The monitoring method additionally comprises the determination 52 of a second status variable C2 of the drive component from the at least one first frequency f1 and the at least one second frequency f2. The determined second status variable C2 is for example a torque M which is delivered by an asynchronous machine. For this purpose, a slip frequency fΔ of the asynchronous machine is determined from a stator frequency and a rotor frequency. From the slip frequency fΔ and the stator frequency fs, also called the synchronous frequency, is calculated for example a slip S in relation to the stator frequency fs:

$$S = \frac{f\Delta}{fs}.$$

A current torque M delivered by the asynchronous machine is calculated from the slip S, for example according to the Kloss formula:

$$M = M_k \cdot \frac{2}{\frac{S}{S_k} + \frac{S_k}{S}},$$

where $M_k$ designates the pull-out torque and $S_K$ the pull-out sap. The pull-out torque $M_k$ and the pull-out slip $S_K$ are motor-specific characteristic variables which can be provided for example via an app.

In summary, the invention relates to a method for monitoring the operation of a drive component. In order to minimize additional hardware overheads, it is proposed to perform the monitoring method by means of a coil 30 which is integrated in a mobile terminal 28, said method comprising steps as follows: capturing an electromagnetic variable B outside a housing 18 of the drive component by means of the integrated coil 30, determining 42 at least one first frequency f1 on the basis of the captured electromagnetic variable B, and determining 44 a first status variable C1 of the drive component from the at least one first frequency f1.

What is claimed is:

1. A method for monitoring operation of a drive component by a coil integrated in a mobile terminal and configured for contactless charging of the mobile terminal, in particular using the Qi standard, wherein the drive component is designed as an electric rotating machine with a rotor and a stator which are accommodated in a housing of electric rotating machine, the method comprising:
    capturing an electromagnetic variable of the drive component outside the housing of the electric rotating machine by the integrated coil;
    measuring a flux leakage field of the stator with the integrated coil;
    determining based on the captured electromagnetic variable a first frequency which comprises a stator frequency as determined from a temporal and in particular periodical change of the flux leakage field; and
    determining a first status variable of the drive component from the first frequency.

2. The method of claim 1, wherein the electromagnetic variable is a current which is induced in the integrated coil by an electromagnetic alternating field of the drive component.

3. The method of claim 1, further comprising capturing an external flux leakage field of the drive component by the integrated coil.

4. The method of claim 1, wherein the first frequency is determined by an evaluation unit of the mobile terminal, with the evaluation unit being connected to the integrated coil.

5. The method of claim 1, wherein the first frequency is determined using a fast Fourier transform.

6. The method of claim 1, wherein the drive component is an asynchronous machine.

7. The method of claim 1, further comprising determining an operating status of the electric rotating machine using the stator frequency.

8. The method of claim 1, further comprising:
    capturing an additional physical variable of the drive component by a sensor integrated in the mobile terminal;
    determining a second frequency based on the captured additional physical variable; and
    determining a second status variable of the drive component from the first frequency and the second frequency.

9. The method of claim 8, wherein the additional physical variable is captured by measuring a vibration and/or an acoustic signal.

10. A control unit designed to perform a method for monitoring or of a drive component by a coil integrated in a mobile terminal and configured for contactless charging of the mobile terminal, in particular using the Qi standard, wherein the drive component is designed as an electric rotating machine with a rotor and a stator which are accommodated in a housing of electric rotating machine, the method comprising:
   capturing an elector variable of the drive component outside the housing of the electric rotating machine by the integrated coil;
   measuring a flux leakage field of the stator with the integrated coil;
   determining based on the captured electromagnetic variable a first frequency which comprises a stator frequency as determined from a temporal and in particular periodical chance of the flux leakage field; and
   determining a first status variable of the drive component from the first frequency.

11. A computer program product embodied in a non-transitory computer readable medium comprising commands which, when executed by a control unit, cause the control unit to execute a method for monitoring operation of a drive component by a coil integrated in a mobile terminal and configured for contactless charging of the mobile terminal, in particular using the Qi standard, wherein the drive component is designed as an electric rotating machine with a rotor and a stator which are accommodated in a housing of electric rotating machine, the method comprising:
   capturing an electromagnetic variable of the drive component outside the housing of the electric rotating machine by the integrated coil;
   measuring a flux leakage field of the stator with the integrated coil;
   determining based on the captured electromagnetic variable a first frequency which comprises a stator frequency as determined from a temporal and in particular periodical change of the flux leakage field; and
   determining a first status variable of the drive component from the first frequency.

12. A mobile terminal, comprising an integrated coil configured for contactless charging of the mobile terminal, in particular using the Qi standard, for capturing an electromagnetic variable of a drive component designed as an electric rotating machine comprising a rotor and a stator which are accommodated in a housing, wherein the electromagnetic variable is measured in a flux leakage field of the stator outside the housing of the electric rotating machine, and a stator frequency is determined from a temporal and in particular periodical change of the flux leakage field.

13. The mobile terminal of claim 12, further comprising an evaluation unit configured to determine a first frequency based on the captured electromagnetic variable.

14. A device for monitoring operation of a drive component designed as an electric rotating machine with a rotor and a stator which are accommodated in a housing, the device comprising:
   a mobile terminal;
   a coil integrated in the mobile terminal and configured for contactless charging of the mobile terminal, in particular using the Qi standard, said coil configured to capture an electromagnetic variable of the drive component outside the housing of the drive component and to capture a temporal change of a flux leakage field of the electric rotating machine; and
   an evaluation unit configured to determine a first frequency, which comprises a stator frequency, based on the captured electromagnetic variable and to determine a first status variable of the drive component from the first frequency.

15. The device of claim 14, wherein the evaluation unit is part of the mobile terminal.

16. The device of claim 14, wherein the coil is configured to capture a current which is induced in the coil by an electromagnetic alternating field of the drive component.

17. The device of claim 14, wherein the evaluation unit is assigned at least partially to a central IT infrastructure.

18. The device of claim 14, further comprising a sensor integrated in the mobile terminal and configured to capture an additional physical variable of the drive component, said evaluation unit configured to determine a second frequency based on the captured additional physical variable and to determine a second status variable of the drive component from the first frequency and the second frequency.

19. The device of claim 18, wherein the sensor comprises an acceleration sensor and/or an acoustic sensor.

* * * * *